United States Patent [19]

Nacci

[11] 4,050,942
[45] Sept. 27, 1977

[54] NITROSO-DIMER-CONTAINING COMPOSITIONS AND PHOTOIMAGING PROCESS

[75] Inventor: George Raymond Nacci, Wilmington, Del.

[73] Assignee: E. I. Du Pont de Nemours and Company, Wilmington, Del.

[21] Appl. No.: 688,931

[22] Filed: May 21, 1976

Related U.S. Application Data

[63] Continuation-in-part of Ser. No. 560,711, March 21, 1975, abandoned, which is a continuation-in-part of Ser. No. 452,338, March 18, 1974, abandoned.

[51] Int. Cl.$^2$ .................. G03C 1/70; G03C 1/727
[52] U.S. Cl. .................. 96/115 R; 96/35.1; 96/86 P
[58] Field of Search .......... 96/115 R, 35.1, 11 SP, 96/36.3, 36.2, 86 P; 204/159.18, 159.23

[56] References Cited

U.S. PATENT DOCUMENTS

| | | | |
|---|---|---|---|
| 3,203,801 | 8/1965 | Heiart | 96/87 R |
| 3,625,696 | 12/1971 | Krauch et al. | 96/86 P |

OTHER PUBLICATIONS

Bluhm et al., Nature, 21S, pp. 1478–1479, (1967).

*Primary Examiner*—John D. Welsh

[57] ABSTRACT

Described are photopolymerizable compositions containing
  a. an ethylenically unsaturated compound,
  b. about 3–95% by weight of an organic polymeric binder,
  c. about 0.1–5% by weight of a nitroso dimer which is a noninhibitor of free-radical polymerization but thermally dissociates to nitroso monomer which is an inhibitor of free-radical polymerization, and
  d. about 0.1–2% by weight of an organic, radiation-sensitive, free-radical generating system.

Positive-working, contour images are formed by applying a layer of this composition to a substrate, imagewise exposing the photopolymerizable layer to actinic radiation through an image-bearing transparency at about 20°–65° C, whereby free-radicals are consumed by nitroso monomer, deactivating the nitroso dimer inhibitor system, reexposing at least the unexposed portion of the photopolymerizable layer to actinic radiation while continuing to maintain the nitroso dimer inhibitor system in the deactivated state, and developing the resulting image. The nitroso dimer inhibitor system may be deactivated by cooling the photopolymerizable layer to below about 10° C, and reexposing the layer to radiation that does not appreciably dissociate the nitroso dimer at a temperature below about 10° C, or by heating the photopolymerizable layer at about 80°–150° C thereby destroying the nitroso dimer inhibitor system, and reexposing the layer to actinic radiation at about 20°–60° C.

17 Claims, No Drawings

NITROSO-DIMER-CONTAINING COMPOSITIONS AND PHOTOIMAGING PROCESS

CROSS-REFERENCE TO RELATED CASES

This is a continuation-in-part of my copending application Ser. No. 560,711, filed Mar. 21. 1975 abandoned, which is in turn a continuation-in-part of my application Ser. No. 452,338, filed Mar. 18, 1974, now abandoned.

BACKGROUND OF THE INVENTION

1. Field of the Invention

This invention relates to a method for producing images, and especially positive-working, contour images from photopolymerizable layers containing nitroso dimers.

2. Description of the Prior Art

In the U.S. application of Pazos, Ser. No. 324,880 and Nacci et al., Ser. No. 324,877, both filed Jan. 18, 1973, and now abandoned, photopolymerizable compositions are described which contain (1) nongaseous, ethylenically unsaturated compound capable of polymerization by free-radical initiated chain propagation, (2) an organic, radiation-sensitive, free-radical generating system, and (3) a thermally dissociable nitroso dimer. These inventions are based on the fact that nitroso dimers are not free-radical polymerization inhibitors, but dissociate to active inhibiting nitroso monomers. Such compounds added to conventional photopolymer compositions thus act as a source of an effective inhibitor for polymerization which extends shelf life and effectively prevents polymerization by thermal initiation. These compositions are used in a single exposure system to give photopolymerized films with greatly improved resolution.

In U.S. application Ser. No. 542,566, filed Jan. 20, 1975, W. J. Nebe describes a two-exposure method of making a positive-working image on a substrate by a. applying to the substrate a layer of photopolymerizable composition containing (1) nongaseous ethylenically unsaturated compound capable of addition polymerization by free-radical initiated chain propagation, (2) 0.1–10% by weight, based on the photopolymerizable composition, of a nitroso dimer which is a noninhibitor of free-radical polymerization and is dissociated by short wavelength unltraviolet radiation to nitroso monomer which is an inhibitor of free-radical polymerization, and (3) 0.001–1.0 part by weight, per part of unsaturated compound, of an organic free-radical generating system activatable by actinic radiation that does not dissociate the nitroso dimer to nitroso monomer, b. imagewise exposing a portion of the photopolymerizable layer through an image-bearing transparency to ultraviolet radiation that dissociate the nitroso dimer to nitroso monomer, thereby inhibiting photopolymerization in the exposed areas, c. exposing a greater portion of the photopolymerizable layer, including the areas exposed to the imagewise exposure radiation, to actinic radiation that activates the free-radical generating system but does not dissociate the nitroso dimer to nitroso monomer, whereby a positive polymeric image is formed in the areas not exposed to the imagewise exposure radiation.

That invention, is based on the fact that nitroso dimers are not free-radical polymerization inhibitors, but are photochemically dissociated to nitroso monomers which are inhibitors of free-radical polymerization by exposure to short wavelength ultraviolet radiation during the imagewise exposure step. The actinic radiation exposure is conducted using radiation that includes wavelengths which activate the free-radical generating system but does not include wavelengths which dissociate the nitroso dimer to nitroso monomer.

During the actinic radiation exposure free-radicals are generated in the area struck by the imagewise exposure radiation just as they are in the other areas. In the area struck by the imagewise exposure, however, the nitroso monomer inhibitor formed by dissociation of nitroso dimer during the imagewise exposure interferes with the normal free-radical induced polymerization process. Accordingly, polymerization does not take place in the area struck by the imagewise exposure radiation.

It is believed that the nitroso monomer inhibits polymerization by reaction with free-radicals or with photoactivated nitroso monomer to form stable nitroxide radicals which do not propagate the free-radical chain process and hence serve as efficient chain terminators. The reactions believed to be operating are outlined in equation 1-3, wherein

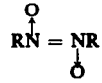

represents a typical nitroso dimer and RNO* represents a photoexcited nitroso monomer species,

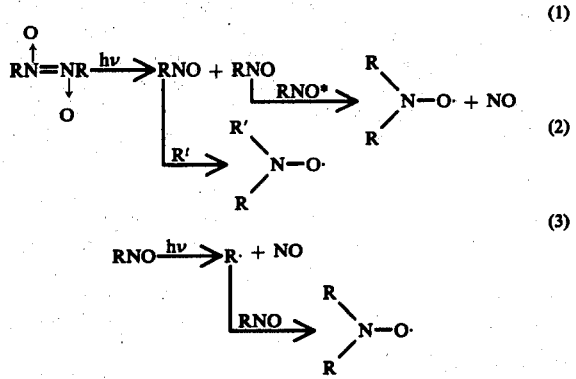

In the context of photohardenable or photopolymerizable systems, a "positive image" in the photosensitive layer is one in which the areas of the layer corresponding to the dark or opaque areas of the original (e.g., a process transparency) are photohardened while the areas corresponding to the light or transparent areas of the original are not substantially photohardened. A "positive image" of this kind provides a "positive-working system". The nonphotohardened material can be removed by means such as solvent wash-out, thereby leaving the photohardened material as a relief on the substrate. The resulting substrate with the so-developed layer can be used as either a relief or planographic printing plate to print true copies of the original.

SUMMARY OF THE INVENTION

The present invention relates to a photopolymerizable composition which comprises 1. at least one nongaseous, ethylenically unsaturated compound capable of forming a high polymer by free-radical initiated chain addition propagation, 2. about 3-39% by weight, based on the total composition, of an organic polymeric binder having a molecular weight of at least about 4000, 3. about 0.1-5% by weight, based on the total composition, of a nitroso dimer which is a noninhibitor of free-radical polymerization but thermally dissociated to nitroso monomer which is an inhibitor of free-radical polymerization, and is characterized by a. a dissociation constant of about $10^{-2} - 10^{-10}$ in solution at 25° C, and b. a rate of dissociation having a half-life of at least about 30 seconds in solution at 25° C; and 4. about 0.1-2% by weight, based on the total composition, of an organic, radiation-sensitive free-radical generating system, with the proviso that, when the amount of free-radical generating system is about 1-2%, the weight ratio of nitroso dimer to free-radical generating system is greater than about 2 to 1.

The present invention also comprises a method for producing an image on a substrate by the process which comprises a. applying a layer of the photopolymerizable composition described above to the substrate, b. imagewise exposing the photopolymerizable layer through an image-bearing transparency at a temperature of about 20-65° C to radiation which activates the free-radical generating system thereby generating free-radicals, whereby the free-radicals are consumed by reaction with the nitroso monomer, c. essentially completely deactivating the nitroso dimer inhibitor system, d. reexposing at least the unexposed portion of the photopolymerizable layer to radiation which activates the free-radical generating system to generate free-radicals while continuing to maintain the nitroso dimer inhibitor system in the essentially completely deactivated state, whereby photopolymerization takes place, and e. developing the resulting image.

Deactivation of the nitroso dimer inhibitor system can be carried out in several ways. For example, steps (c) and (d) can be carried out by;

c. cooling the photopolymerizable layer to a temperature below about 10° C to inactivate the nitroso dimer inhibitor system, and d. reexposing at least the previously unexposed portion of the photopolymerizable layer at a temperature below about 10° C to radiation which does not appreciably dissociate the nitroso dimer, or c. heating the photopolymerizable layer at about 80°-150° C thereby destroying the nitroso dimer inhibitor system, and d. reexposing at least the unexposed portion of the photopolymerizable layer to radiation at a temperature of about 20°-60° C.

DESCRIPTION OF THE PREFERRED EMBODIMENTS

The present invention is based on the discovery that nitroso dimer-containing photopolymerizable compositions containing less free-radical generating system than was used in the prior art for a given level of nitroso dimer can be used to give high quality, positive-working, contour images by the novel process described herein. In each of the prior art processes, the composition has to contain sufficient free-radical initiator to both overcome the inhibiting effect of nitroso monomer and cause photopolymerization. In single exposure prior art processes, the initiator has to be present in an amount sufficient that destruction of some initiator during accidental exposure to heat does not deplete the supply the initiator at any given locus. In the two-exposure prior art systems, some inhibiting nitroso monomer will be present during the second exposure even in the areas not struck by radiation and thus sufficient initiator must be present to override this effect. In accordance with the present invention, however, the nitroso dimer inhibitor system is essentially completely deactivated prior to the second exposure.

The process of this invention involves two exposures. During the first imagewise exposure, photopolymerization does not occur. The concentration of nitroso monomer in equilibrium with nitroso dimer is sufficient to prevent the chain propagation required for polymerization. During this exposure the free-radicals formed through absorption of radiation by the initiator are consumed by the nitroso monomer. As nitroso monomer is consumed the equilibrium reaction continually provides more nitroso monomer.

Between the first and second exposures, the nitroso dimer inhibitor system is essentially completely deactivated. The second exposure is then carried out while maintaining the nitroso dimer inhibitor system in the essentially completely deactivated state. During this second exposure, polymerization occurs only in those areas where significant concentrations of photoinitiator remain, i.e., in areas not struck by radiation during the first exposure.

By "essentially completely deactivated" it is meant that for all practical purposes the nitroso dimer inhibitor system is completely deactivated. This term, however, allows those minor amounts of active nitroso dimer inhibitor system to be present which do not materially affect the result which would be achieved if the nitroso dimer system were completely deactivated.

Several different methods of deactivating the nitroso dimer inhibitor system may be used. One such method is to lower the temperature of the system to below about 10° C. Since nitroso dimer is in thermal equilibrium with monomer,

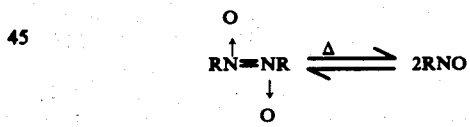

a decrease in temperature of the photopolymerizable composition shifts the equilibrium thereby decreasing the relative concentration of nitroso monomer molecules present. Hence, during the second exposure at significantly lower temperatures, the concentration of nitroso monomer is insufficient to prevent radical chain propagation of unsaturated compound and photopolymerization occurs.

In an alternative mode of this invention, it is possible to effectively destroy the nitroso dimer inhibitor system by use of a heating step after the first imagewise exposure. Thus, the composition is heated for sufficient time to essentially completely convert nitroso dimer and monomer to inactive species. It is believed that these inactive species are largely the isomeric oxime compounds, although in the case of tertiary nitroso compounds other inactive species are also likely to be formed. After the heating period, the second nonimagewise exposure can be carried out at a convenient temperature, which may be the same as, above, or below the temperature of the first exposure.

The photopolymerizable compositions used in accordance with this invention must contain at least one ethylenically unsaturated compound. Suitable unsaturated compounds are the nongaseous, ethylenically unsaturated compounds capable of forming a high polymer by free-radical initiated chain addition propagation described in Burg et al., U.S. Pat. No. 3,060,023; Martin et al., U.S. Pat. No. 2,927,022; and Hertler, Belgium Pat. No. 769,694. In addition, the polymerizable, ethylenically unsaturated polymers described in Burg, U.S. Pat. No. 3,043,805; and Martin U.S. Pat. No. 2,929,710 and similar materials may be used, alone or mixed with other material. The photocrosslinkable polymers disclosed in Schoenthaler, U.S. Pat. No. 3,418,295, and Celeste, U.S. Pat. No. 3,448,089 may also be used. The amount of unsaturated compound added varies with the particular polymer used.

The preferred compounds are those having a plurality of addition polymerizable, ethylenic linkages, particularly when present as terminal linkages, and especially those wherein at least one, and preferably most, of such linkages are conjugated with a doubly bonded carbon, including carbon doubly bonded to carbon and to push heteroatoms as nitrogen, oxygen and sulfur. Outstanding are such materials wherein the ethylenically unsaturated groups, especially the vinylidene groups, are conjugated with ester or amide structures, for example, compounds such as an alkylene or polyalkylene polyol triacrylate.

Suitable unsaturated compounds include unsaturated esters of alcohols, preferably polyols and particularly such esters of α-methylenecarboxylic acids, for example, ethylene glycol diacrylate, diethylene glycol diacrylate, glycerol diacrylate, glycol triacrylate, mannitol polyacrylate, sorbitol polyacrylates, ethylene glycol dimethacrylate, 1,3-propanediol dimethacrylate, 1,2,4-butanetriol trimethacrylate, trimethylolpropane triacrylate, triethylene glycol diacrylate, 1,4-cyclohexanediol diacrylate, 1,4-benzenediol dimethacrylate, pentaerythritol di-, tri-, and tetramethacrylate, dipentaerythritol polyacrylate, pentaerythritol di-, tri-, and tetraacrylates, 1,3-propanediol diacrylate, 1,5-pentanediol dimethyacrylate, p-α,α-dimethylbenzylphenyl acrylate, the bis-acrylates and methacrylates of polyethylene glycols of molecular weight about 200–4000, and the like; unsaturated amides, particularly those of α-methylenecarboxylic acids, and especially those of α,ω-diamines and oxygen-interrupted α, ω-diamines, such as methylene bis-acrylamide, methylene bis-methacrylamide, ethylene bis-methacrylamide, 1,6-hexamethylene bis-acrylamide, diethylene triamine tris-methacrylamide, bis-(γ-methacrylamido-propoxy)ethane, β-methacrylamidoethyl methacrylate, N-(β-hydroxyethyl)-β-(methacrylamido) ethyl acrylate, and N,N-bis(β-methacryloxyethyl) acrylamide; vinyl esters such as divinyl succinate, divinyl adipate, divinyl phthalate, divinyl terephthalate, divinyl benzene-1,3-disulfonate, and divinyl butane-1,4-disulfonate; styrene and derivatives thereof; and unsaturated aldehydes, such as sorbaldehyde (hexanedienal).

The photopolymerizable compositions of this invention must also contain an organic polymer binder having a molecular weight of at least about 4000. The word "organic", as used throughout the specification and claims, designates compounds which contain carbon, and one or more of oxygen, hydrogen, nitrogen, sulfur and halogen, but are free of metal. The binders are normally employed in concentrations of about 3–95% by weight, based on the total composition, and preferably about 25–75%.

Suitable polymer binders include:

A. Copolyesters, e.g., (a) those prepared from the reaction product of a polymethylene glycol of the formula $HO(CH_2)_nOH$, wherein $n$ is a whole number from 2 to 10, and (1) hexahydroterephthalic, sebacic and terephthalic acids, (2) terephthalic, isophthalic and sebacic acids, (3) terephthalic and sebacic acids, or (4) terephthalic and isophthalic acids, and (b) mixtures of copolyesters prepared from said glycols and (i) terephthalic, isophthalic and sebacic acids, and (ii) terephthalic, isophthalic, sebacic and adipic acids;

B. Nylons or polyamides, e.g., N-methoxymethyl polyhexamethylene adipamide;

C. Vinylidene chloride copolymers, e.g., vinylidene chloride/acrylonitrile, vinylidene chloride/methyl methacrylate, and vinylidene chloride/vinyl acetate copolymers;

D. Ethylene/vinyl acetate copolymers;

E. Cellulosic ethers, e.g., methyl cellulose, ethyl cellulose and benzyl cellulose;

F. Polyethylene;

G. Synthetic rubbers, e.g., butadiene/acrylonitrile, copolymers, and chloro-2-butadiene-1,3-polymers;

H. Cellulose esters, e.g., cellulose acetate, cellulose acetate succinate and cellulose acetate butyrate;

I. Polyvinyl esters, e.g., polyvinyl acetate/acrylate, polyvinyl acetate/methacrylate, and polyvinyl acetate;

J. Polyacrylate and α-alkyl polyacrylate esters, e.g., polymethyl methacrylate, polyethyl methacrylate, polymethyl methacrylate/acrylic acid, and polymethyl methacrylate/-methacrylic acid;

K. High molecular weight polyethylene oxides of polyglycols having average molecular weights from about 4000 to 1,000,000;

L. Polyvinyl chloride and copolymers, e.g., polyvinyl chloride/acetate:

M. Polyvinyl acetal, e.g., polyvinyl butyral, and polyvinyl formal;

N. Polyformaldehyde;

O. Polyurethanes;

P. Polycarbonates; and

Q. Polystyrenes.

A preferred group of binders includes the polyacrylates and α-allkylacrylate esters, particularly polymethyl methacrylate and polymethyl methacrylate/ethyl acrylate copolymers.

Although thermoplastic binders are normally and preferably employed, there can be added, in addition to or instead of said binders, nonthermoplastic polymeric compounds to improve certain desirable characteristics, e.g., adhesion to the base support, adhesion to the image-receptive support on transfer, wear properties, chemical inertness, etc. Suitable nonthermoplastic polymeric compounds include polyvinyl alcohol, cellulose, anhydrous gelatin, phenolic resins, melamine-formaldehyde resins, and the like. If desired, the photopolymerizable layers can also contain immiscible polymeric or nonpolymeric organic or inorganic fillers or reinforcing agents which are essentially transparent at the wavelengths used for the exposure of the photopolymerizable materials, e.g., the organophilic silicas, bentonites, silica, powdered glass, colloidal carbon, as well as various types of dyes and pigments. Such materials are used in amounts varying with the desired properties of the photopolymerizable layer. The fillers are useful in improving the strength of the compositions, reducing tack and, in addition, as coloring agents.

When the polymer is a hard, high-melting compound, a plasticizer is usually used to lower the glass transition temperature and facilitate selective development. The plasticizer may be any of the common plasticizers compatible with the polymeric binder. Among the common plasticizers are dialkyl phthalates, alkyl phosphates, polyethylene glycol, polyethylene glycol esters, and polyethylene glycol ethers. The particular nature of the unsaturated compound/binder system is not critical to this invention.

The third component which is essential to the photopolymerizable composition is a nitroso dimer which is a noninhibitor of free-radical polymerization but thermally dissociates to nitroso monomer which is an inhibitor of free-radical polymerization. These nitroso dimers contain a dinitroso group which can be of the structure

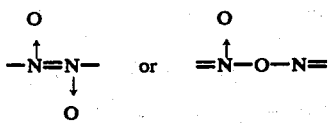

The structure of the remainder of the compound is not important provided it does not contain groups which inhibit free-radical polymerization. The actual configuration of the dinitroso group of the first structure, whether cis or trans, is immaterial, but the configuration is believed to be mainly trans except when constrained to the cis configuration by a ring structure.

The nitroso dimer will generally have a dissociation constant no greater than about $10^{-2}$ in solution at 25° C so that excessive nitroso monomer is not present in the portion of the photopolymerizable layer to be photopolymerized. Some monomer will be present, however, since the nitroso dimers generally have a dissociation constant of at least about $10^{-10}$ in solution at 25° C. These nitroso dimers also generally have a rate of dissociation having a half-life of at least about 30 seconds and preferably at least about 1 minute in solution at 25° C. The dissociation half-life of the dimer can be determined using known techniques, for example, by measuring the rate of colored nitroso monomer formation by visible spectroscopy.

A typical nitroso dimer of the first structure thermally dissociates in accordance with the equation:

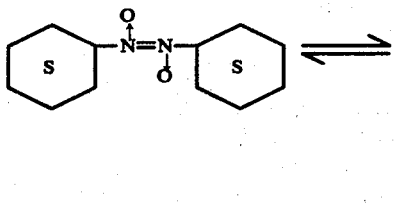

The nitroso monomer may contain one or more nitroso groups. When the nitroso monomer contains two or more nitroso groups, the association of the nitroso groups in the nitroso dimer may be intramolecular rather than intermolecular.

A typical nitroso dimer of the first structure having an intramolecular association of the nitroso groups thermally dissociates in accordance with the equation:

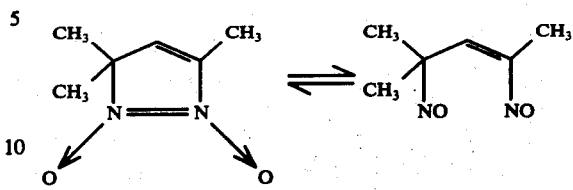

A typical nitroso dimer of the second structure thermally dissociates in accordance with the equation:

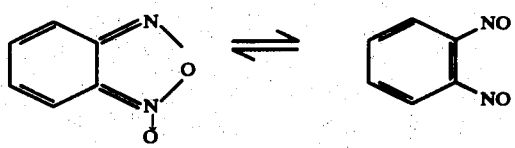

The perferred nitroso dimers are those which, in the monomeric form, have at least one nitroso group attached to a primary or secondary carbon atoms, although nitroso dimers in which the nitroso group is attached to an activated tertiary carbon atom are also useful. Also suitable are certain nitroso dimers in which at least one of the nitrogen atoms, in the noninhibitor or inhibitor form, is attached to a 6-membered aromatic ring or to the beta carbon of a vinyl group attached to a 6-membered aromatic ring. These compounds are referred to herein, for simplicity, as aromatic nitroso dimers.

Suitable examples of nitroso dimers include:

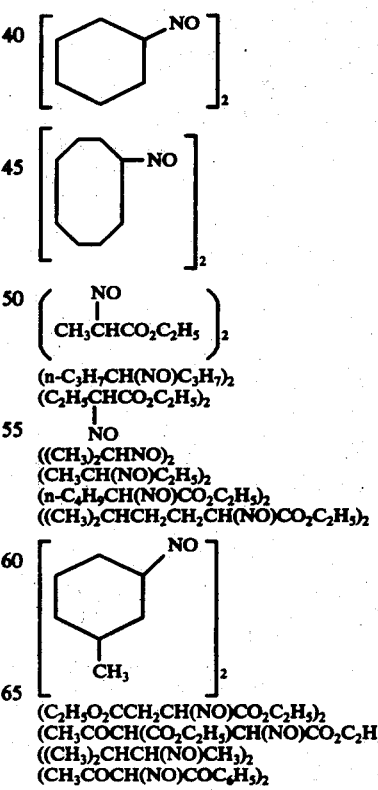

-continued

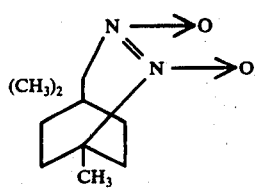

(C$_6$H$_5$COCH(NO)COC$_6$H$_5$)$_2$
(n-CH$_3$OC$_6$H$_5$COCH(NO)COC$_6$H$_5$)$_2$

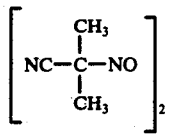

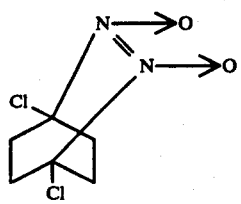

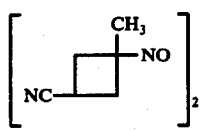

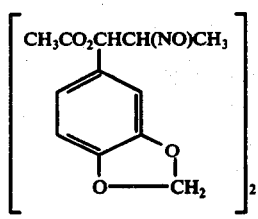

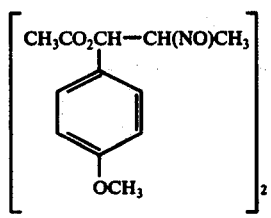

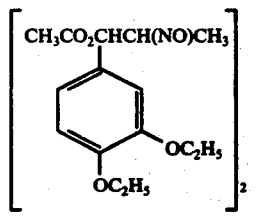

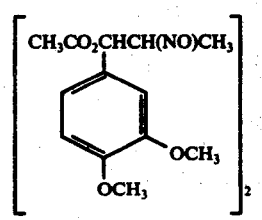

-continued

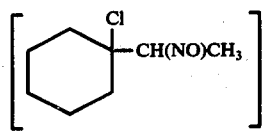

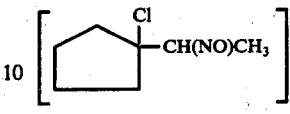

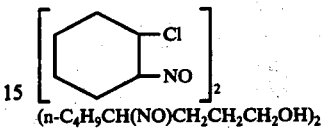

(n-C$_4$H$_9$CH(NO)CH$_2$CH$_2$CH$_2$OH)$_2$

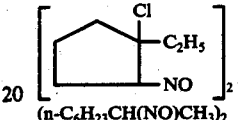

(n-C$_6$H$_{23}$CH(NO)CH$_3$)$_2$

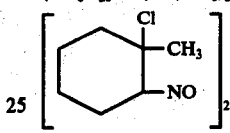

(CH$_3$CH(HO)Cl)$_2$
(HO(CH$_2$)$_6$NO)$_2$

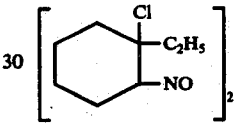

((CH$_3$)$_2$CCH$_2$CH(NO)C(CH$_3$)$_2$ONO$_2$)$_2$
(CH$_3$CH(Cl)CH(NO)CH$_3$)$_2$

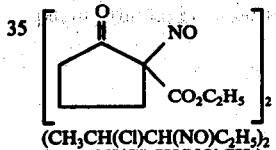

(CH$_3$CH(Cl)CH(NO)C$_2$H$_5$)$_2$
(C$_6$H$_5$CH(Cl)CH(NO)CH$_3$)$_2$

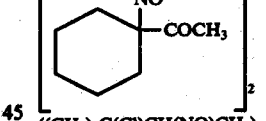

((CH$_3$)$_2$C(Cl)CH(NO)CH$_3$)$_2$
(C$_2$H$_5$COC(CH$_3$)(NO)CH$_3$)$_2$

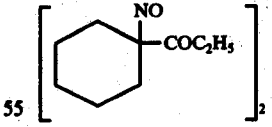

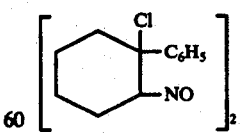

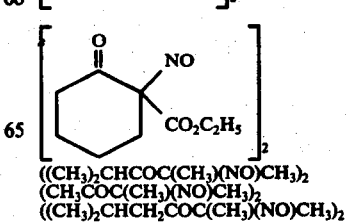

((CH$_3$)$_2$CHCOC(CH$_3$)(NO)CH$_3$)$_2$
(CH$_3$COC(CH$_3$)(NO)CH$_3$)$_2$
((CH$_3$)$_2$CHCH$_2$COC(CH$_3$)(NO)CH$_3$)$_2$

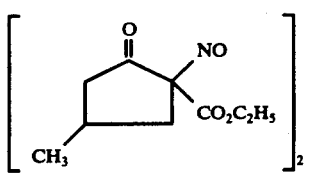
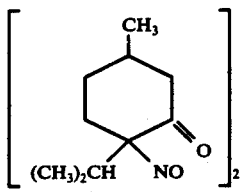
([(CH₃)₃C]₂CHNO)₂
(C₆H₅COC(CH₃)(NO)CO₂C₂H₅)₂
(CH₃NO)₂
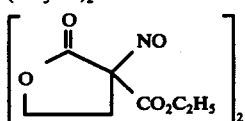
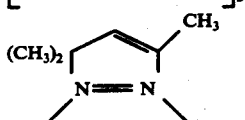
(CH₃C(CH(CH₃)₂)₂CH₂NO)₂
(CH₃(CH₂)₁₆CH₂NO)₂
(CH₃(CH₂)₁₀CH₂NO)₂
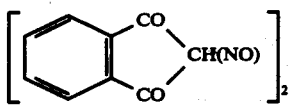
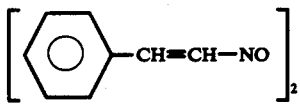
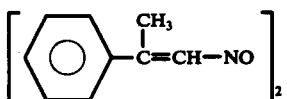
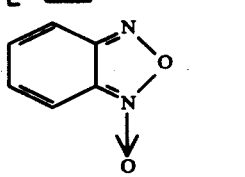
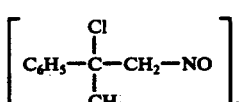
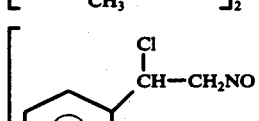
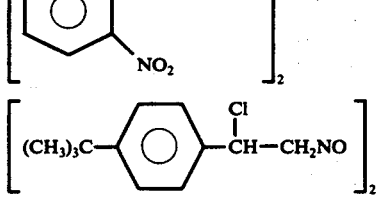
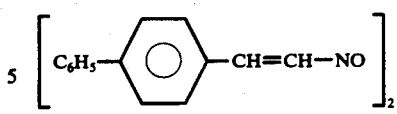
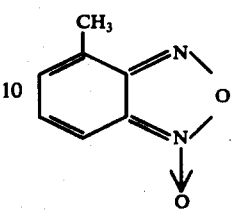
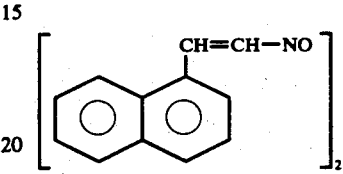
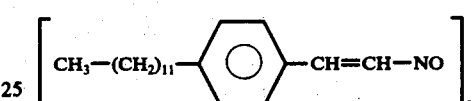
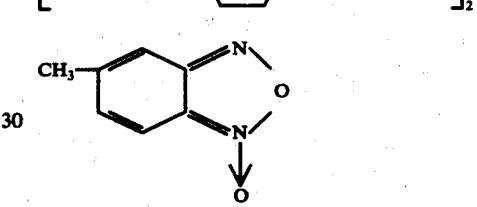
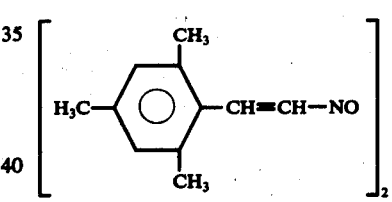
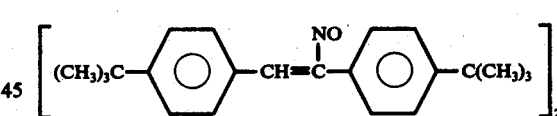
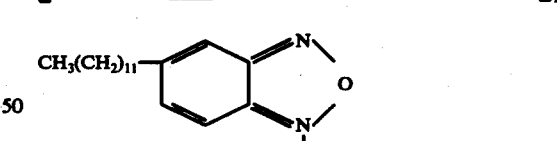
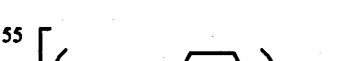
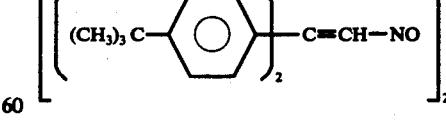
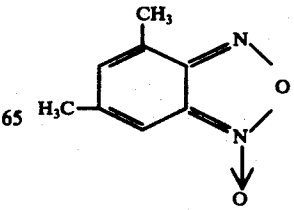

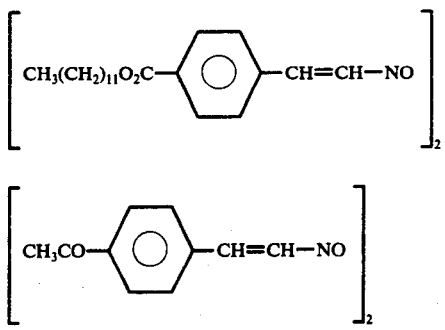

The nitroso dimers are ordinarily employed in concentrations of about 0.1–5% by weight based on the total photopolymerizable composition. The preferred amount in any specific case will depend upon the particular unsaturated compound/initiator system employed. In general, the preferred amount of nitroso dimer will be about 0.15–2% by weight based on the total composition.

The fourth component which the photopolymerizable coating composition must contain is an organic, radiation-sensitive, free-radical generating system which initiates polymerization of the unsaturated compound and does not subsequently terminate the polymerization. The free-radical generating system should absorb radiation within the range of about 2000–8000A and have at least one component that has an active radiation absorption band with a molar extinction coefficient of at least about 50 within the range of about 3400–8000A, and preferably about 3400–5000A. "Active radiation absorption band" means a band of radiation which is active to produce the free radicals necessary to initiate polymerization of the unsaturated material. The free-radical generating system can comprise one or more compounds which directly furnish free radicals when activated by radiation. It can also comprise a plurality of compounds, one of which yields free radicals after having been caused to do so by a sensitizer which is activated by the radiation.

A large number of such compounds can be utilized in the practice of this invention including aromatic ketones such as benzophenone, Michler's ketone (4,4'-bis(-dimethyl- amino)benzophenone), 4,4'-bis(diethylamino)-benzophenone, 4- acryloxy-4'-dimethylaminobenzophenone, 4-acryloxy-4'-diethyl-aminobenzophenone, 4-methoxy-4'-dimethylaminobenzophenone, 2-ethylanthraquinone, phenanthrenequinone, benzoin, benzoin ethers such as benzoin methyl ether, benzoin ethyl ether and benzoin phenyl ether, methylbenzoin, ehtylbenzoin and other aromatic ketones; and 2,4,5-triarylimidazolyl dimers such as 2-(o-chlorophenyl)-4,5-diphenylimidazolyl dimer, 2-(o-chlorophenyl)-4,5-di(m-methoxyphenyl)imidazolyl dimer, 2-(o-fluorophenyl)-4,5-diphenylimidazolyl dimer, 2-(o-methoxyphenyl)-4,5-diphenylimidazolyl dimer, 2-(p-methoxyphenyl)-4,5-diphenylimidazolyl dimer, 2,4-di(p-methoxy-phenyl)-5-phenylimidazolyl dimer, 2-(2,4-dimethoxyphenyl)-4,5-diphenylimidazolyl dimer, 2-(p-methylmercaptophenyl)-4,5-diphenylimidazolyl dimer, and the like as disclosed in U.S. Pat. Nos. 3,479,185 and 3,784,557 and in British Pat Nos. 997,396, published July 7, 1965, and 1,047,569, published Nov. 9, 1966; and bis(p-aminophenyl-α,β-unsaturated) ketones as described in U.S. Pat. No. 3,652,275.

The preferred initiators are the 2,4,5-triaryl-imidazolyl dimers. These are used with a free-radical producing electron donor agent, such as 2-mercaptobenzoxazole, leuco cyrstal violet or tris(4-diethylamino-2-methylphenyl)-methane, which is preferred. Sensitizers such as Michler's ketone may be added. Various energy transfer dyes such as Rose Bengal and Eosin Y can also be used. Additional examples of suitable initiators are disclosed by Plambeck in U.S. Pat. No. 2,760,863. The preferred free-radical generating systems employ a triarylimidazolyl dimer and a free-radical producing electron donor agent, with or without the use of a sensitizing compound as described in U.S. Pat. No. 3,479.185 to Chambers. The concentration of the free-radical generating system employed should be about 0.1–2% by weight based on total composition, and preferably about 0.2–0.9% by weight.

As is known from the work of Donaruma, J. Org. Chem., 23, 1338 (1958), applied to nitrosocyclohexane dimer, isomerization of nitroso dimers to oximes is catalyzed by acids and bases. When components containing basic amino groups are present in the photopolymerizable composition, it may be necessary to add a suitable acid in an amount sufficient to neutralize all or a portion of these amino groups in order to obtain compositions which have good shelf stability. Such amino-containing components may include the unsaturated compound, the polymeric binder, one or more of the components of the free-radical generating system, or any additional components such as plasticizers, adhesion promoters, etc.

For neutralization of these amino groups, it is preferred to employ a mineral or organic acid having a dissociation constant in aqueous solution greater than about $1.3 \times 10^{-5}$. Dissociation constants of organic and inorganic acids in aqueous solutions can be found, e.g., in the "Handbook of Chemistry and Physics," 55th Ediction 1974–1975, D129–D130, CRC Press Inc., Cleveland, Ohio. The preferred acid is trifluoroacetic acid because of the good coating characteristics of the resulting compositions.

The amount of acid necessary to provide shelf stability for the composition will depend upon the concentration of the amino groups in the composition. About 0.25 to about 1.0 mole of acid per mole of amino groups is usually satisfactory, and preferably about 0.33 to about 0.67 mole per mole. When reagent grade methylene chloride is employed as a solvent in compositions which are applied to a substrate by coating, it is usually not necessary to add acid since a trace amount of acid is usually present in this solvent.

The photopolymerizable compositions described herein may be applied to a wide variety of substrates. By "substrate" is meant any natural or synthetic support, especially one which is capable of existing in a flexible or rigid film or sheet form. For example, the substrate could be a metal sheet or foil, a sheet or film of synthetic organic resin, cellulose paper, fiberboard, and the like, or a composite of two or more of these materials. Specific substrates include copper, alumina-blasted aluminum, oriented polyester film, alumina-blasted oriented polyester film, polyvinylidene chloride-coated oriented polyester film, polyvinyl alcohol-coated paper, cross-linked polyester-coated paper, nylon, polypropylene film, glass, heavy paper such as lithographic paper, and the like. A copper base is preferred.

The particular substrate will generally be determined by the use application involved. When the photopolymerizable compositions are applied to metal surfaces, they may be useful for making presensitized lithographic and gravure printing plates. For example, application of a photopolymerizable layer to a grained aluminum base results in a lithographic printing plate. In use, the developed plate is first coated with water and is then contacted with a roller which wets only the photopolymer image with ink. The inked plate can then be used in lithographic printing in the usual way.

The photopolymerizable compositions can also serve as photoresists in making etched or plated circuits or in chemical milling applications. They are also useful for preparing colored images from color separation negatives suitable for color-proofing. The images formed with these elements may also be used for making copies by thermal transfer to a substrate. Specific uses will be evident to those skilled in the art; many uses are disclosed in U.S. Pat. Nos. 2,760,863; 3,060,023; 3,060,026 and 3,469,982.

Processes for applying a layer of photopolymerizable composition to a substrate are well known. In a preferred process the components of the photopolymerizable composition are dissolved together in a solvent in which the components are preferably completely soluble and the resulting solution is poured or painted onto the substrate. Preferred solvents include chlorinated hydrocarbons, especially methylene chloride.

The first exposure to actinic radiation is an imagewise exposure through a process transparency; that is, an image-bearing transparency consisting solely of areas substantially opaque and substantially transparent to the radiation being used, where the opaque areas are substantially of the same optical density; for example, a so-called line or halftone negative or positive. Process transparencies may be constructed of any suitable materials including cellulose acetate film and polyester film.

The radiation used during the imagewise exposure may have wavelengths over the entire actinic radiation range of about 2000–8000A. Suitable sources of such radiation, in addition to sunlight, include carbon arcs, mercury-vapor arcs, fluorescent lamps with ultraviolet radiation-emitting phosphors, argon glow lamps, electronic flash units and photographic-flood lamps. Other fluorescent light sources such as the tracings on the face of a cathode ray tube may be used. Electron accelerators and electron beam sources through an appropriate mask may also be used in the first imagewise exposure.

Where artificial radiation sources are used, the distance between the photosensitive layer and the radiation source may be varied according to the radiation sensitivity of the composition and the nature of the unsaturated compound. Customarily, mercury-vapor arcs are used at a distance of about 1.5–20 inches (3.8–50.8 cm) from the photopolymerizable layer. Radiation fluxes of about 20–2000 $\mu w/cm^2$ are generally suitable for use.

The length of time the compositions are exposed to radiation may vary upwards from about a few seconds. The exposure times will vary, in part, according to the nature and the concentration of the unsaturated compound and initiator, and the type of radiation.

The first exposure is carried out with the photopolymerizable layer at a temperature of about 20°–65° C. At these temperatures the nitroso dimer-monomer equilibrium will provide sufficient nitroso monomer. The important result achieved during the first exposure is that free-radicals are consumed by reaction with nitroso monomer in the areas struck by actinic radiation.

After this first exposure, the nitroso dimer inhibitor system is deactivated so that photopolymerization can take place during the second exposure uninhibited by the nitroso dimer inhibitor system. Deactivation can be accomplished either by shifting the nitroso dimer-monomer equilibrium essentially completely to the inactive dimer side or by essentially completely destroying the nitroso dimer inhibitor system. Shifting of the equilibrium to the inactive dimer side can be accomplished by cooling the photopolymerizable layer below about 10° C, and preferably below about 1° C. The nitroso dimer inhibitor system can be destroyed by heating the layer at about 80°–150° C for sufficient time to essentially completely destroy the inhibition system. Preferably the layer is heated at about 90°–125° C.

The second exposure is carried out by reexposing at least the previously unexposed portion of the photopolymerizable layer to actinic radiation while continuing to maintain the nitroso dimer inhibitor system in the essentially completely deactivated state. Generally, this exposure is an overall exposure including the areas struck by radiation during the first imagewise exposure.

When the method of deactivating the nitroso dimer inhibitor system is cooling, the radiation should have wavelengths essentially limited to those that do not appreciably dissociate the nitroso dimer since short wavelength radiation will shift the nitroso dimer/monomer equilibrium even at temperatures below 10° C. In general, this means that the wavelengths should be essentially limited to about 3400–8000A. For all practical purposes, this limitation on the wavelength of radiation does not require any special equipment since radiation which passes through normal glass is generally limited to wavelengths of about 3400–8000A. In the case of aromatic nitroso dimers, however, the wavelengths should be essentially limited to about 3800–8000A. When an aromatic nitroso dimer is used, it is preferred to use a simple filter which satisfactorily absorbs radiation below about 3800A. By "essentially limited to those that do not appreciably dissociate the nitroso dimer" it is meant that any radiation of wavelengths below about 3400A, or 3800A in the case of aromatic nitroso dimers, is present in such minor amounts that it does not materially affect the desired result. When the nitroso dimer inhibitor system is destroyed by heating, short wavelength radiation has no adverse effect during the second exposure.

The exposed photopolymerizable layer may be developed into positive-working contour images by removing the unpolymerized ethylenically unsaturated compound from the layer and leaving behind only the polymeric replica or the original. This may be accomplished by solvent washout, thermal transfer, pressure transfer, differential adhesion of the exposed versus unexposed areas, heating under conditions such that some or all of the volatile components are vaporized leaving behind the photopolymer, and so forth. The conditions of thermal development selected will depend upon the nature of the substrate, the volatility of the components to be removed, and the thermal stability of the components. A preferred method of removing the unpolymerized material is to employ a suitable solvent applied by an air spray. The use of an air spray rather than the conventional method of spraying liquid solvents enables advantage to be taken of the high relief achieved with the photopolymerizable layers of the present invention.

Negative-working images may be produced by dusting or toning the exposed layer with dyes or pigments that adhere to the tacky unpolymerized areas struck by radiation during the imagewise exposure, but not to the photohardened areas.

The following examples are given to illustrate the novel photopolymerizable compositions and photoimaging methods of this invention.

In these examples, the coating solutions were prepared by dissolving the reactants in reagent grade methylene chloride at 25° C. The solutions were applied to "ones oz." (28g) copper-clad circuit boards, 100 mils (0.25 cm) thick, using a doctor knife. The copper surfaces of the boards were cleaned with pumice powder and water just before the photopolymer solutions were applied. The coatings were dried at 25° C and those coatings so identified were coated with a 1% by weight polyvinyl alcohol solution (Elvanol® 51-05) in water using a cotton ball dampened with the polymer solution. Coating thicknesses (dried) of these topcoats were 0.05 mil (0.000127 cm) or less.

Samples were exposed in a glass vacuum frame (nuArc Co.) at 1 mm pressure or under nitrogen at atmospheric pressure to a medium pressure mercury resonance lamp (100 W AH4) held 4 in (10.1 cm) away from the sample, except as otherwise noted. The system was evacuated for 2 minutes prior to exposure and during the exposure. Unless otherwise specified Itek Corp. silver image film transparencies of a 1951 Air Force test pattern were used with the emulsion side of the pattern in contact with the photopolymerizable layer. After the exposures, the samples were washed with cold water to remove the polyvinyl alcohol coatings and then spray-developed (unless otherwise noted) using methyl chloroform in a spray gun held two inches (5.1 cm) from the samples. The developed samples were examined optically.

EXAMPLE 1

A stock solution of a mixture of 2.90 g of trimethylolpropane triacrylate (contained 245 ppm hydroquinone inhibitor), 0.88 g of conventional plasticizers 0.44 g of triethylene glycol diacetate, 5.24 g of polymethyl methacrylate resin, 0.03 g of tris(4-diethylamino-2-methylphenyl) methane. and 0.02 g of an adhesion promoter dissolved in 40 ml of methylene chloride was prepared. To one-half of this solution was added 0.02 g of 2-o-chlorophenyl-4,5-diphenylimidazolyl dimer. To one-quarter of the resulting solution was added 0.015 g of nitrosocyclohexane dimer and the resulting solution applied to a copper-clad circuit board. The solvent was evaporated at 25° C to leave a coating 20 mils (0.05 cm) thick. The plate was exposed through a line negative, under vacuum as described, for 10 minutes at 25° C. The exposed plate was cooled at 0° C for 5 minutes, the negative removed, and the plate reexposed at 0° C under nitrogen for 10 minutes. After development as described, a recessed image was observed to a depth of 90 microns below the surface of the remainder of the photopolymer.

By choice of process transparencies with various optical densities and contrasts, contour images have been obtained.

EXAMPLE 2

A stock solution similar to that of Example 1 was prepared except that no tris(4-diethylamino-2-methylphenyl)methane was added. To one-half of this solution was added 0.02 g of 2-o-chlorophenyl-4,5-diphenylimidazolyl dimer and 0.0005 g of tris(4-diethylamino-2-methylphenyl)methane. To one-quarter of the resulting solution was added 0.002 g of nitrosocyclohexane dimer and the resulting solution applied to a copper-clad circuit board as described. The dried plate was exposed through the Air Force test pattern, under vacuum as described, for 20 minutes at 25° C. The exposed plate was heated at 100° C for 5 minutes, and the plate was reexposed without the transparency at 25° C for 7 minutes. After development as described, a positive image with resolution of 16 line pairs/mm was obtained.

EXAMPLE 3

The solution of Example 1 was prepared and applied to a copper-clad circuit board as described therein. The plate was exposed through a silver step tablet having an optical density of 0.3 difference per step for 30 minutes at 25° C under nitrogen. The exposed plate was cooled at 0° C for 5 minutes, and the entire plate reexposed without the step tablet at 0° C for 10 minutes.

After development as described, a 5-step contour image was obtained in which the steps were separated from one another by approximately 1 mil in height. The fifth step (from the base) was ~5.5 mils (.014 cm) thick. In the areas struck by the most radiation in the first exposure, the least amount of polymer was formed.

This imaging technique is useful for making gravure printing plates, three-dimensional objects, embossing roll surfaces, etc.

EXAMPLE 4

This example demonstrates the use of an added ultraviolet radiation absorber to increase the range of image depth with respect to the optical density of the original transparency.

A stock solution of a mixture of 5.80 g of trimethylolpropane triacrylate, 1.76 g of conventional plasticizers, 0.88 g of triethylene glycol diacetate, 10.48 g of polymethyl methacrylate resin, 0.04 g of an adhesion promoter, 0.08 g of 2-o-chlorophenyl-4,5-diphenylimidazolyl dimer, 0.06 g of tris(4-diethylamino-2-methylphenyl)methane and 0.16 g of nitrosocyclohexane dimer dissolved in 32 ml of methylene chloride and 8 ml of 2-ethoxyethanol was prepared. To one-quarter of this solution was added 0.08 g of 4-dodecyloxy-2-hydroxybenzophenone ultraviolet absorber, and the resulting solution was applied to a copper-clad circuit board. The solvent was evaporated at 25° C to leave a 14-mil (0.035 cm) thick coating. The plate was exposed through a process transparency which varied in optical density from 0.05-0.60. The process transparency consisted of an epoxy replica containing fine black (magnetite) particles cast from a silicone rubber mold made from a Jefferson 5-cent coin. Exposure was carried out at 25° C under nitrogen for 4 minutes with the lamp 2.5 inches (6.4 cm) from the plate. The exposed plate was cooled at 0° C for 5 minutes and then reexposed without the transparency for 5 minutes at 0° C. After development as described, a positive contour image was obtained with relief of up to 11 mils (0.028 cm).

EXAMPLE 5

A stock solution of a mixture of 1.45 g of trimethylolpropane triacrylate, 0.44 g of conventional plasticizers, 0.22 g. of triethylene glycol diacetate, 2.62 g of polymethyl methacrylate resin, 0.01 g of an adhesion promoter, 0.02 g of 2-o-chlorophenyl-4,5-diphenylimidazolyl dimer, and 0.015 g of tris(4-diethylamino-2-methylphenyl)methane dissolved in 32 ml of methylene chloride and 8 ml of 2-ethoxyethanol was prepared. To one-eighth of this solution was added 0.001 g of nitrosocyclohexane dimer, and the resulting solution was applied to a copper-clad circuit board. The plate was exposed through the Air Force test pattern under vacuum as described at 25° C for 5 minutes. The plate was cooled to 0° C and reexposed without the transparency under nitrogen through a ¼in Pyrex plate for 10 minutes. After development as described, a high contrast positive image was obtained in which washout of unpolymerized unsaturated compound occurred down to the plate surface.

Similarly coated plates were used to study the effect of exposure times on resolution. In these experiments the time of first exposure was varied between 4 and 15 minutes, and the time of second exposure between 5 and 15 minutes. Best resolution occurred with a 15-minute first exposure and a 7.5-minute second exposure. The resulting positive image had a resolution of 32 line pairs/mm. In these experiments a 5-mil (0.0127 cm) oriented polyester film was interposed between the sample and radiation source during the second exposure to remove radiation of wavelength less than about 3400A.

EXAMPLE 6

This example demonstrates application of the imaging process with deactivation of the inhibitor system by cooling to a negative-working pigment toning process.

A stock solution of a mixture of 3.05 g of trimethylolpropane triacrylate, 0.44 g of conventional plasticizers, 0.22 g of triethylene glycol diacetate; 2.62 g of polymethyl methacrylate resin, 0.01 g of an adhesion promoter, 0.02 g of 2-o-chlorophenyl-4,5-diphenylimidazolyl dimer and 0.015 g of tris(4-diethylamino-2-methylphenyl)methane disolved in 32 ml of methylene chloride and 8 ml of 2-ethoxyethanol was prepared. To one-eighth of this solution was added 0.005 g of nitrosocyclohexane dimer, and the resulting solution was applied to a 0.007 inch (.0178 cm) film of the type described in Alles, U.S. Pat. No. 2,779,684, having a coating of a vinylidene chloride/methylacrylate/itaconic acid (90:10:2) terpolymer. The solvent was evaporated and the coated film was covered with a polyolefin film and exposed under vacuum as described through a half-tone transparency at 25° C for 2 minutes. The film was cooled to 0° C for 2 minutes and then reexposed at 0° C for 2 minutes without the transparency. The exposed films were separated by peeling them apart and toned with a green pigmented particle toner. An image was formed on the coated layer, i.e., toner adhered to the areas of the substrate struck by radiation during the initial exposure.

EXAMPLE 7

This example demonstrates application of the imaging process to a negative-working pigment toning process with deactivation of the inhibitor system by heating. A coated film was prepared exactly as described in Example 6 it was first exposed through the half-tone transparency at 25° C for 5 minutes. The film was then heated at 90° C for 5 minutes and reexposed at 25° C for 3.5 minutes without the negative. The exposed film was developed as described in Example 6 to give an image on the coated layer.

EXAMPLE 8

This example demonstrates the preparation of a gravure plate using the imaging process with deactivation of the inhibitor system by cooling.

A stock solution of a mixture of 2.90 g of trimethylolpropane triacrylate, 0.88 g of conventional plasticizers, 0.44 g of triethylene glycol diacetate, 5.24 g of polymethyl methacrylate resin, 0.04 g of 2-o-chlorophenyl-4,5-diphenylimidazoyl dimer, 0.08 g of nitrosocyclohexane dimer, 0.02 g of an adhesion promoter, and 0.03 g of tris-(4-diethylamino-2-methylphenyl)methane dissolved in 32 ml of methylene chloride and 8 ml of 2-ethoxyethanol was prepared. To one-eighth of this solution was added 0.02 g of 4-dodecyloxy-2-hydroxybenzophenone ultraviolet absorber and 0.0002 g of a yellow ultraviolet screen dye (Auramine® 0) and the resulting solution was applied to a copper-clad circuit board and dried at 25° C. The plate was cooled at 0° C, atmospheric pressure, under a nitrogen atmosphere and exposed for 4 minutes through a 150 dots/inch pattern with the lamp 2.5 inches (6.4 cm) from the plate to establish a grid pattern. A ¼in Pyrex plate was interposed between the lamp and the plate. The pattern was removed and the plate was reexposed at 25° C in an imagewise exposure in the vacuum frame for 15 minutes through a continuous tone negative with the lamp 4 inches (10.1 cm) away from the plate. This exposure removes initiator from the surface of the film and serves to prevent polymerization as a function of depth. The plate was cooled to 0° C and exposed at atmospheric pressure, nitrogen atmosphere, for 3 minutes without the negative to achieve photopolymerization from the "bottom up". In this last exposure, the lamp was placed 2.5 inches (6.4 cm) from the plate. After development as described, a gravure image was observed on the plate. Printing with this gravure plate was demonstrated by linking it with Sinclair and Valentine magnetite red No. 6350 ink, removing the excess ink, and transferring the image to paper. cl EXAMPLE 9

A stock solution of a mixture of 5.2 g of a polymethyl methacrylate/acrylic acid resin, 3.7 g of trimethylolpropane triacrylate, 0.7 g of conventional plasticizer and 0.01 g of adhesion promoter was dissolved in 40 ml of methylene chloride which contained 6% by volume of methanol. To one-half of this solution was added 0.05 g of a benzophenone and 0.005 g of Michler's ketone. To one-quater of the resulting solution was added 0.030 g of nitrosocyclohexane dimer and the resulting solution applied to a copper-clad circuit board. The solvent was evaporated at 25° C to leave a 2.0-mil (0.005 cm) dried coating. The plate was exposed through a line negative under nitrogen, as described, at 25° C for 16 minutes, heated at 110° C for 20 minutes, and the plate reexposed, without the negative at 25° C for 17 minutes. After development as described, a positive image was obtained.

EXAMPLE 10

A stock solution of a mixture of 5.88 g of trimethylolpropane triacrylate, 2.64 g of conventional plasticizers, 10.48 g of polymethyl methacrylate resin, and 0.04 g of an adhesion promoter dissolved in 80 ml of methylene chloride was prepared. To one-quarter of this solution was added 0.03 g of 2-ethylanthraquinone. To one-quarter of the remaining solution was added 0.010 g of nitrosocyclohexane dimer and the resulting solution was coated onto a copper-clad circuit board to give a 1.2-mil (.0031 cm) dry coating. The board was topcoated with a polyvinyl alcohol solution, and the resulting plate exposed through a line negative as described in Example 9 at 60° C for 1-2 minutes. The exposed plate was cooled to 0° C and reexposed without the negative for 1 minute. A positive image was obtained.

I claim:
1. A photopolymerizable coating composition which comprises
   1. at least one, nongaseous, ethylenically unsaturated compound capable of forming a high polymer by free-radical initiated chain addition propagation,
   2. 3-95% by weight, based on the total composition, of an organic polymeric binder having a molecular weight of at least 4000,
   3. 0.1-5% by weight, based on the total composition, of a nitroso dimer which is a noninhibitor of free-radical polymerization but thermally dissociates to nitroso monomer which is an inhibitor of free-radical polymerization, and is characterized by
      a. a dissociation constant of $10^{-2} - 10^{-10}$ in solution at 25° C, and
      b. a rate of dissociation having a half-life of at least 30 seconds in solution at 25° C; and
   4. 0.1 - 0.9% by weight, based on total composition, of an organic, radiation-sensitive free-radical generating system.
2. The composition of claim 1 in which the free-radical generating system is present in the amount of 0.2-0.9% by weight based on the total composition.
3. The composition of claim 2 in which the unsaturated compound contains a plurality of terminal addition polymerizable ethylenic linkages wherein at least one such linkage is conjugated with a double bonded carbon.
4. The composition of claim 3 in which the unsaturated compound is an acrylic ester.
5. The composition of claim 4 in which the unsaturated compound is trimethylolpropane triacrylate.
6. The composition of claim 4 in which the free-radical generating system is a 2,4,5-triarylimidazolyl dimer and a free-radical producing electron donor agent.
7. The composition of claim 6 in which the free-radical generating system is 2-o-chlorophenyl-4,5-diphenylimidazolyl dimer and tris(4-diethylamino-2-methylphenyl) methane.
8. The composition of claim 4 in which the photopolymerizable composition contains 0.15 - 2% by weight, based on the total composition, of nitrosocyclohexane dimer.
9. The composition of claim 4 in which the photopolymerizable composition contains 25 - 75% by weight, based on the total composition, of polymethyl methacrylate resin.
10. The composition of claim 1 in the form of a photopolymerizable layer on a substrate.
11. A photopolymerizable coating solution which comprises the composition of claim 1 dissolved in methylane chloride.
12. A method for producing an image on a substrate by the process which comprises
    a. applying to the substrate a layer of a photopolymerizable coating composition which comprises
       1. at least one, nongaseous, ethylenically unsaturated compound capable of forming a high polymer by free-radical initiated chain addition propagation,
       2. 3-95% by weight, based on the total composition, of an organic polymeric binder having a molecular weight of at least 4000,
       3. 0.1-5% by weight, based on the total composition, of a nitroso dimer which is a noninhibitor of free-radical polymerization but thermally dissociates to nitroso monomer which is an inhibitor of free-radical polymerization, and is characterized by
          a. a dissociation constant of $10^{-2} - 10^{-10}$ in solution at 25° C, and
          b. a rate of dissociation having a half-life of at least 30 seconds in solution at 25° C, and
       4. 0.1 - 2% by weight, based on total composition, of an organic radiation-sensitive free-radical generating system, with the proviso that when the amount of free-radical generating system is 1-2%, the weight ratio of nitroso dimer to free-radical generating system is greater than 2 to 1,
    b. imagewise exposing the photopolymerizable layer through an image-bearing transparency at a temperature of 20°-65° C to radiation which activates the free-radical generating system to generate free-radicals, whereby the free-radicals are consumed by reaction with the nitroso monomer,
    c. essentially completely deactivating the nitroso dimer inhibitor system,
    d. reexposing at least the previously unexposed portion of the photopolymerizable layer to radiation which activates the free-radical generating system to generate free-radicals while continuing to maintain the nitroso dimer inhibitor system in the essentially completely deactivated state, whereby photopolymerization takes place, and
    e. developing the resulting image.
13. The method of claim 12 in which a positive-working contour image is developed by removing the nonpolymerized portion of the coating.
14. The method of claim 13 in which the nitroso dimer inhibitor system is deactivated by cooling the photopolymerizable layer to a temperature below 10° C, and reexposing at least the previously unexposed portion of the photopolymerizable layer at a temperature below 10° C to radiation which does not appreciably dissociate the nitroso dimer.
15. The method of claim 14 in which the unsaturated compound contains a plurality of terminal addition polymerizable ethyleneic linkages wherein at least one said linkage is conjugated with a double bonded carbon.
16. The method of claim 13 in which the nitroso dimer inhibitor system is deactivated by heating the photopolymerizable layer at 80°-150° C thereby destroying the nitroso dimer inhibitor system, and reexposing at least the previously unexposed portion of the photopolymerizable layer to radiation at a temperature of 20°-60° C.
17. The method of claim 16 in which the unsaturated compound contains a plurality of terminal addition polymerizable ethylenic linkages wherein at least one such linkage is conjugated with a double bonded carbon.

* * * * *

UNITED STATES PATENT OFFICE
CERTIFICATE OF CORRECTION

PATENT NO. : 4,050,942
DATED : September 27, 1977
INVENTOR(S) : George Raymond Nacci It is certified that error appears in the above-identified patent and that said Letters Patent are hereby corrected as shown below:

In the title of the invention (cover page and Column 1, line 2), "NITROSO-DIMER" should read --NITROSO DIMER--.

Column 1, line 19, "application" should read --applications--.

Column 1, line 55, "dissociate" should read --dissociates--.

Column 2, line 22, "equation" should read --equations--.

Column 3, line 1, "39%" should read --95%--.

Column 3, line 6, "dissociated" should read --dissociates--.

Column 4, line 4, "supply the initiator" should read --supply of initiator--.

Column 5, line 25, "push" should read --such--.

Column 5, line 36, "glycol" should read --glycerol--.

Column 8, line 25, "atoms" should read --atom--.

Column 9, third formula from the top, "$(n-CH_3OC_6H_5COCH(NO)COC_6H_5)_2$" should read -- $(p-CH_3OC_6H_4COCH(NO)COC_6H_5)_2$ --.

Column 10, sixth formula from the top, "$(n-C_6H_{23}CH(NO)CH_3)_2$" should read -- $(n-C_6H_{13}CH(NO)CH_3)_2$ --.

UNITED STATES PATENT OFFICE
CERTIFICATE OF CORRECTION

PATENT NO. : 4,050,942
DATED : September 27, 1977
INVENTOR(S) : George Raymond Nacci It is certified that error appears in the above-identified patent and that said Letters Patent are hereby corrected as shown below:

Column 10, line 50,

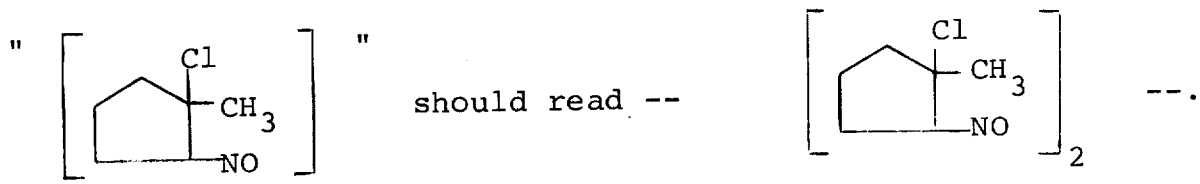

Column 11, before the third formula from the bottom, the following formulae should be inserted,

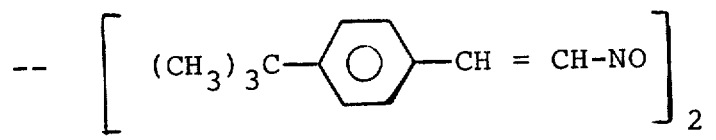

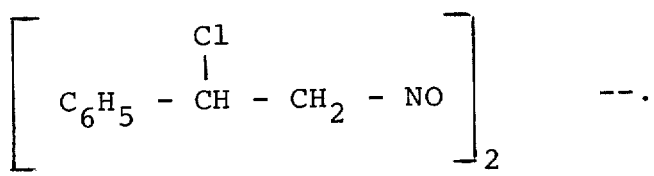

Column 13, line 54, "ehtylbenzoin" should read --ethylbenzoin--.

Column 16, line 16, "inhibition" should read --inhibitor--.

Column 16, line 54, "or" should read --of--.

Column 17, line 12, "ones" should read --one--.

UNITED STATES PATENT OFFICE
CERTIFICATE OF CORRECTION

PATENT NO. : 4,050,942
DATED : September 27, 1977
INVENTOR(S) : George Raymond Nacci It is certified that error appears in the above-identified patent and that said Letters Patent are hereby corrected as shown below:

Column 17, line 42, "plasticizers 0.44" should read --plasticizers, 0.44--.

Column 17, line 50, "nitroscocylohexane" should read --nitrosocyclohexane--.

Column 19, line 35, "diacetate; 2. 62" should read --diacetate, 2.62--.

Column 19, line 63, "6 it" should read -- 6 and it --.

Column 20, line 37, "linking" should read --inking--.

Column 20, line 39, after "paper." delete "cl EX-"

Column 20, line 40, "AMPLE 9" should read --EXAMPLE 9-- as a heading in the center of the Column.

Column 21, line 29, "amout" should read --amount--.

Column 21, line 59, "methylane" should read --methylene--.

Signed and Sealed this

Fourth Day of April 1978

[SEAL]

Attest:

RUTH C. MASON
Attesting Officer

LUTRELLE F. PARKER
Acting Commissioner of Patents and Trademarks